United States Patent [19]

Drosd

[11] Patent Number: 5,036,016

[45] Date of Patent: Jul. 30, 1991

[54] VLSI BIPOLAR TRANSISTOR PROCESS

[75] Inventor: Robert M. Drosd, Aloha, Oreg.

[73] Assignee: Bipolar Integrated Technology, Inc., Beaverton, Oreg.

[21] Appl. No.: 315,356

[22] Filed: Feb. 21, 1989

[51] Int. Cl.[5] .......................................... H01L 21/265
[52] U.S. Cl. ........................................ 437/31; 437/32; 437/26; 437/909; 437/917; 148/DIG. 10; 148/DIG. 11; 148/DIG. 96
[58] Field of Search .................... 437/32, 148, 917, 55, 437/31, 33, 909, 26, 31; 148/DIG. 10, DIG. 11

[56] References Cited

U.S. PATENT DOCUMENTS

| | | | |
|---|---|---|---|
| 4,125,853 | 11/1978 | Fulton et al. | 357/36 |
| 4,433,471 | 2/1984 | Ko et al. | 437/32 |
| 4,866,001 | 9/1989 | Pickett et al. | 437/32 |

FOREIGN PATENT DOCUMENTS

| | | |
|---|---|---|
| 0065463 | 11/1982 | European Pat. Off. . |
| 0103653 | 3/1984 | European Pat. Off. . |
| 61-73371 | 4/1986 | Japan . |

Primary Examiner—Brian E. Hearn
Assistant Examiner—Tuan Nguyen
Attorney, Agent, or Firm—Marger, Johnson

[57] ABSTRACT

A bipolar VLSI process includes masking and patterning, implanting a P+ channel stop and locally oxidizing a lightly P-doped, monolithic silicon substrate to define a collector region. An N-type collector is implanted and the implants are diffused to form a shallow gradient P-N junction. Then, device emitter, base and collector contact features are photolithographically defined by two openings spaced along the length of the collector region. The collector region is formed in a keyhole shape with a wider end portion encompassed by the collector contact feature and adjoining opening and a narrower opposite end portion which includes the base contact and emitter features and intervening opening. Low resistivity P- and N-type regions are implanted in the substrate in the openings; the openings are covered by local oxidation; and the substrate surface region are exposed in the adjoining contact features. The active transistor and the collector, base and emitter contacts are thereby self-aligned within the collector region. A single polysilicon layer is used to form base, collector and emitter contacts and a triple diffused transistor. Portions of the substrate silicon and polysilicon are locally oxidized to isolate the contacts and to define emitter width. The keyhole shape of the collector region defines collector contact width independently of base contact width and emitter length.

20 Claims, 4 Drawing Sheets

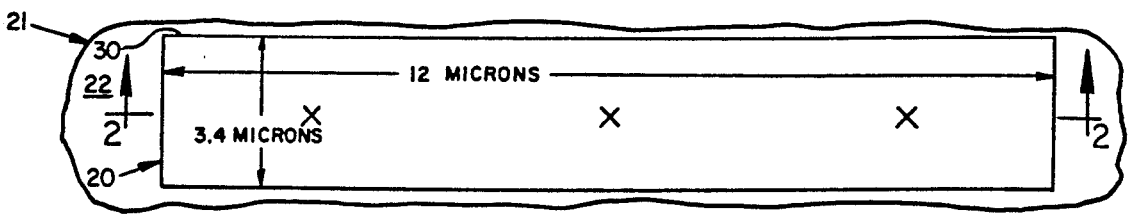
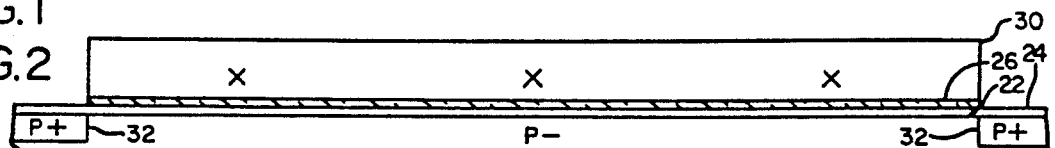
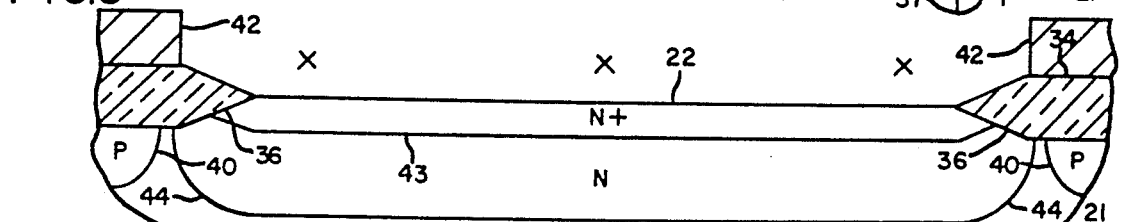
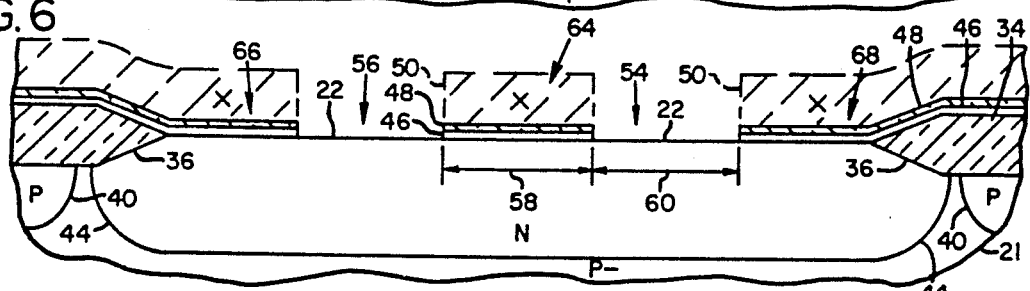
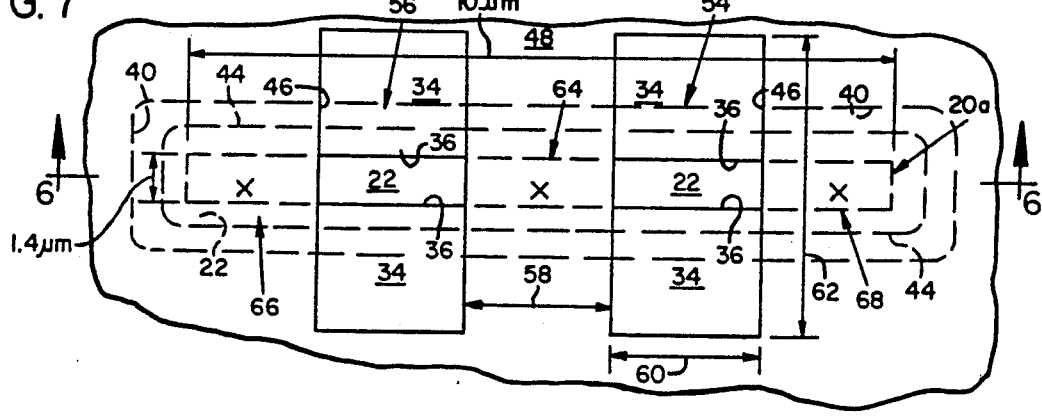

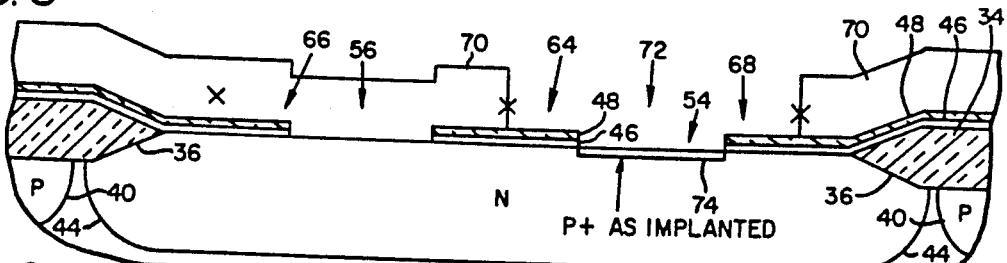
FIG. 8
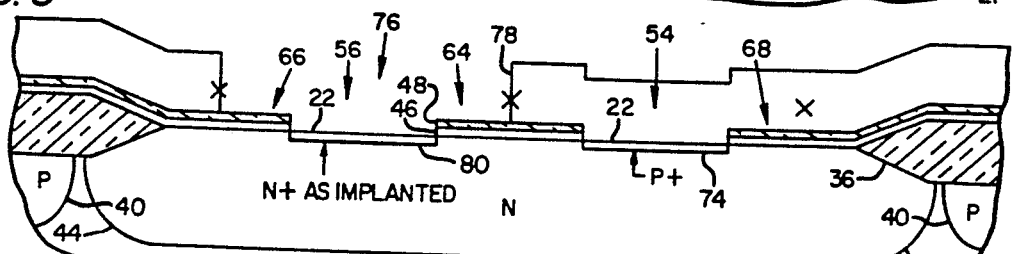
FIG. 9
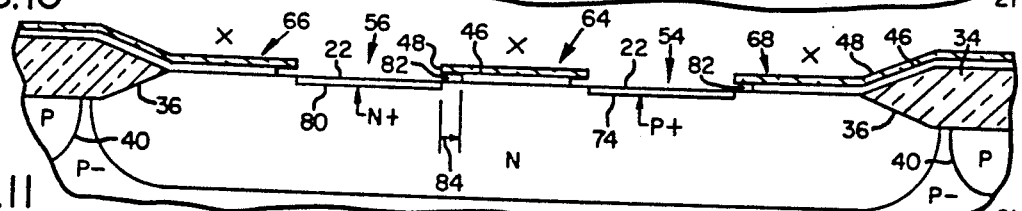
FIG. 10
FIG. 11
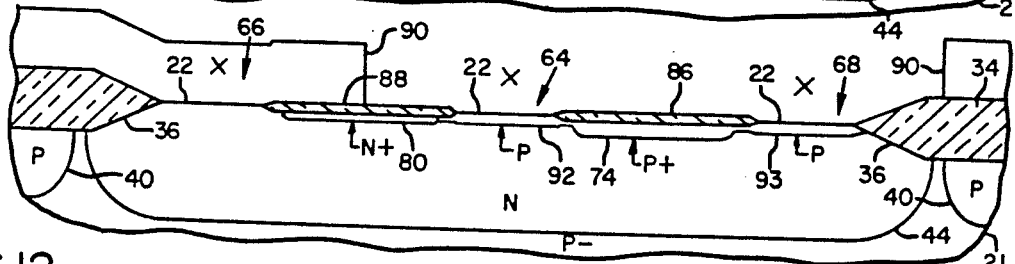
FIG. 12
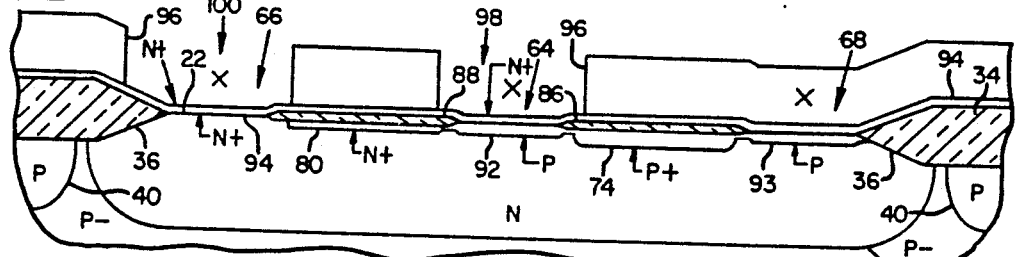
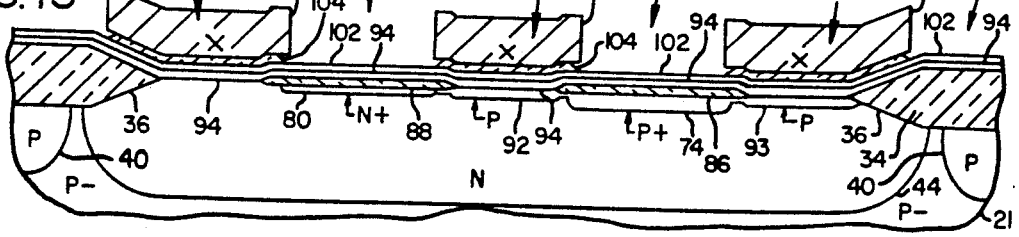
FIG. 13

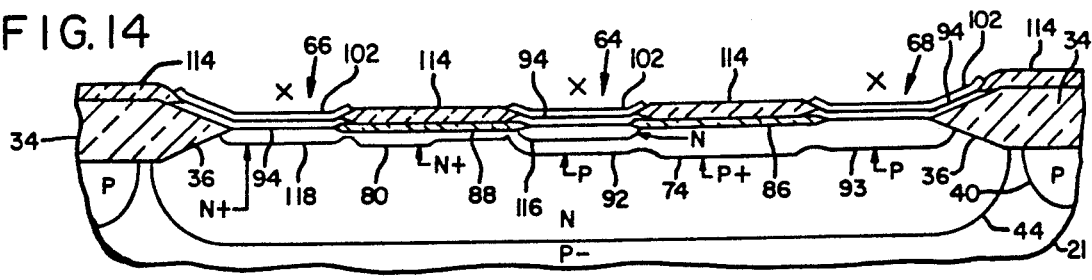
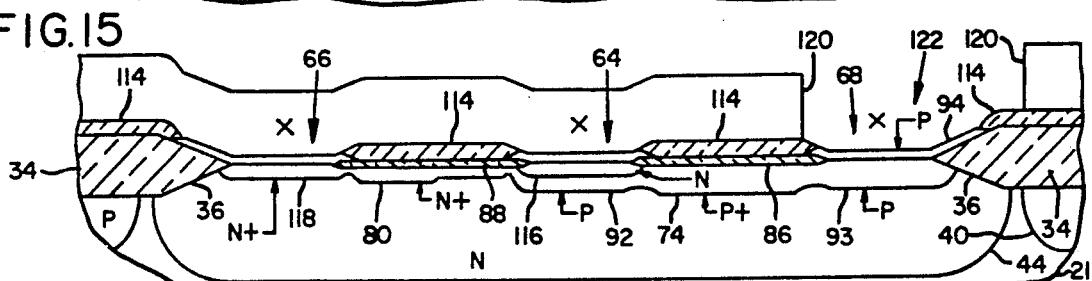
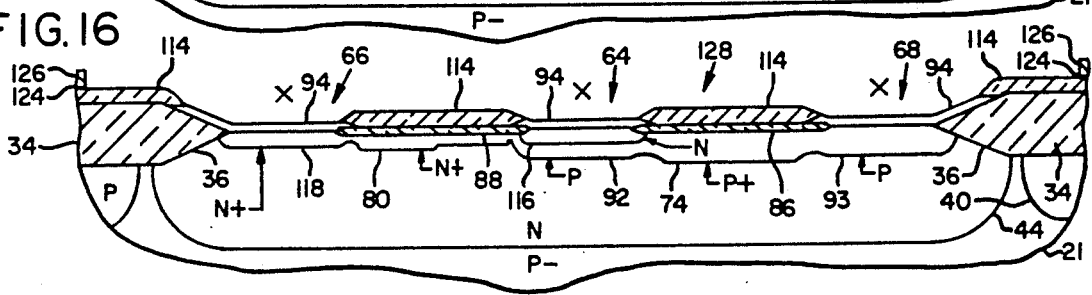
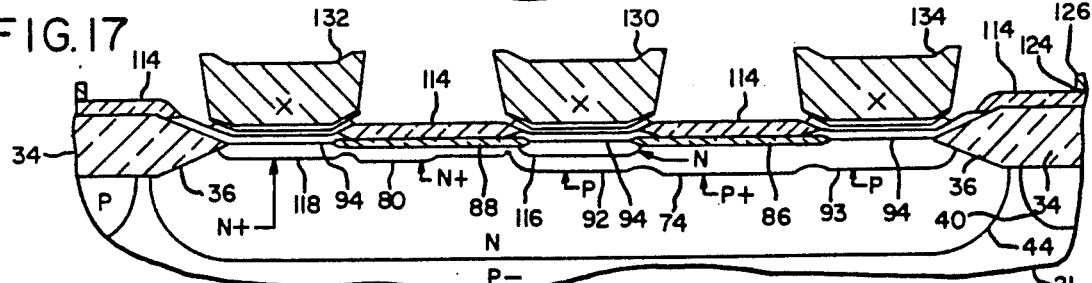
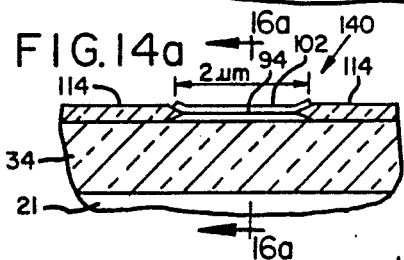
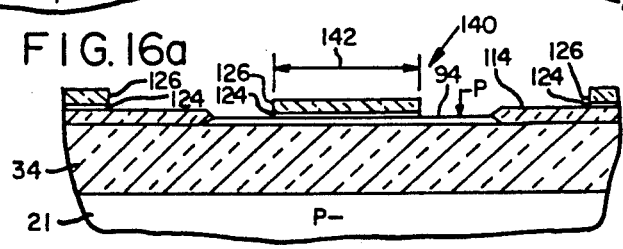
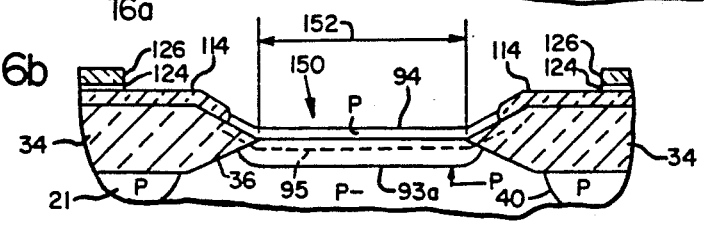

VLSI BIPOLAR TRANSISTOR PROCESS

RELATED APPLICATION DATA

This application is related to copending, commonly-assigned U.S. patent application Ser. No. 07/296,899, filed Jan. 11, 1989, now U.S. Pat. No. 4,866,001, issued Sept. 12, 1989, which is a continuation of Ser. No. 07/214,856, filed July 1, 1988, now abandoned; which is a continuation of Ser. No. 07/019,359, filed Feb. 25, 1987, now abandoned.

BACKGROUND OF THE INVENTION

The present invention relates to processes for the fabrication of very small integrated bipolar transistors, and more particularly to a self-aligned process for fabricating a bipolar transistor with polysilicon contacts.

The trend in semiconductor technologies is toward large scale integration of devices with very high speed, high packing density and low power dissipation. Jointly achieving these characteristics always involves trade-offs, particularly between speed and power dissipation and between power dissipation and packing density.

In general, to achieve the objectives of high packing density, high speed and low power, it is essential that these devices be made as small as possible. In both bipolar and field-effect transistor technologies, it is desirable to reduce the horizontal geometry of the devices. In FET technologies, design objectives focus primarily on reducing gate length, which serves both to reduce the horizontal geometry of the device and to increase its speed of operation. In bipolar technologies, it is desirable to reduce both emitter area and the depth of the vertical junction structure.

Device horizontal geometry depends largely on the photolithographic techniques and tools available. The resolution provided by a particular photolithographic process determines the minimum feature size that ca ordinarily be made in each masking step. Additionally, at very small feature sizes, alignment between mask steps becomes very critical. Although improvements continue to be made, conventional photolithography provides reliable resolution down to just under 2 um. Similarly, obtaining alignment tolerances much below 0.5 um. is very difficult with conventional equipment. As a result, obtaining an economic yield of operative devices becomes very difficult both as device size is reduced and as number of devices per chip is increased.

One of the early attractions of metal-oxide-semiconductor (MOSFET) technology stems from its simplicity, both in number of masking process steps needed to fabricate a device and in the relative ease of obtaining self-alignment between the gate electrode and adjoining diffused regions in the substrate. An example of such technology is shown in L.L. Vadasz et al., "Silicon-gate technology," IEEE Spectrum, October 1969, pages 28-35. More recent MOSFET technology additionally provides self-aligned source and drain electrodes, as shown for example in C.S. Oh, et al., "A New MOSFET Structure with Self-Aligned Polysilicon Source and Drain Electrodes," IEEE Electron Device Letters, Vol. EDL-5, No. Oct. 10, 1984, pages 400-402.

Notwithstanding the improvements shown by comparison of the above-cited references, size and alignment concerns are essentially one dimensional in MOSFET technologies. The width of the gate of FET devices is essentially a matter of design choice. Current MOS technology enable very large scale integrated (VLSI-over 10,000 gates per chip) circuits to be built with a high packing density and with low power requirements. Moreover, VLSI MOS circuits can be produced with a very high yield, commonly around 30%.

The primary disadvantage of MOS technologies, when compared to bipolar technologies, is speed. In MOS devices, gate delays commonly exceed one nanosecond when loaded, especially with a capacitive load. In contrast, bipolar devices can maintain gate delays of about one half nanosecond or better when capacitively loaded.

Bipolar technologies have generally lacked the advantages of MOS technologies. Bipolar devices generally require substantially more power than MOS devices. They also typically require substantially more substrate area per device. Conventional bipolar technologies using emitter-coupled logic (ECL) typically produce transistor areas of over 250 um.$^2$ and dissipate over 10 mW per gate (5 mW per equivalent gate) when operated at speeds providing system propagation delays of 300-500 ps. Common packaging technologies limit total chip power dissipation to around 10 W. These factors result in a substantially lower packing density than MOS devices, limiting bipolar densities to less than 10,000 transistors per chip or about 3000 gates (compared to 10-20,000+ for CMOS), or a substantial tradeoff in speed. Also, because of their complexity, prior bipolar technology yields are low compared to MOS technologies by a factor of two or more (10-15%).

Consequently, commercial scale bipolar technologies have been largely limited to large scale integrated (LSI) circuit packing densities. Bipolar transistors produced by conventional LSI technologies typically have a cut-off frequency $f_t$ of around 3 GHz at 2 mA and exhibit 50 fF of junction capacitance.

In processing a substrate to fabricate a bipolar device, the designer may choose between an epitaxial or a triple diffusion technology. The epitaxial process predominates in commercial use. Examples of epitaxial processes are shown in U.S. Pat. No. 4,381,953 to Ho et al., U.S. Pat. No. 4,483,726 to Isaac et al., U.S. Pat. No. 4,433,471 to Ko et al., U.S. Pat. No. 4,495,010 to Kranzer et al. and in "A Bipolar Process That's Repelling CMOS," Electronics, Dec. 23, 1985, pages 45-47. Examples of triple diffusion technology are described in U.S. Pat. No. 4,276,543 to Miller et al., R. Wolfle, "Fast High-Voltage Silicon Triple-Diffused Power Transistors," Siemens Review XXXIX (1972) No. 8, pages 370-373, and in S. Konaka et al., "A 30 ps Si Bipolar IC Using Super Self-Aligned Process Technology," Extended Abstracts of the 16th (1984 International) Conference on Solid State Devices and Materials, Kobe, 1984, pages 209-212. An analysis of characteristics of epitaxial and triple-diffused transistors appears in W.J. Chudobiak, "On the Static Collector-Emitter Saturation Voltage of a Transistor with a Lightly Doped Collector," Proceedings of the IEEE, April 1969, pages 718-720.

The designer also has a number of choices of how to define various device features, such as active transistor area. Photolithographic techniques are widely used but, as mentioned above, are limited to the resolution of photolithography. In the fabrication of discrete bipolar devices, it is also known to employ controlled undercut techniques to form device features smaller than those provided by photolithography. This technique is described by F. Morandi et al., in "Controlled Undercut Microwave Devices," SGS-Fairchild, S.p.A., Milan, Italy, International Electron Devices Meeting, 23–25 October 1968, Washington, D.C. (abstract published by IEEE 1968), page 108.

Various techniques are conventionally used in MOS technologies to define the device regions as well as to provide insulative field oxide layers over regions between devices. One is the LOCOS technique, described by J.A. Appels et al., "Local Oxidation of Silicon; New Technological Aspects," Philips Research Reports, Vol. 26, No. 3 (June 1971), pages 157–165, and by J.S. Makris et al., "Forming Fine-Line Geometries in Integrated Circuits," IBM Technical Disclosure Bulletin, Vol. 16, No. 10 (March 1974), pages 3240–3241. J.A. Appels et al. also disclose the use of controlled under-etching of nitride-oxide sandwich structures (LOCOS-II method) in the preparation of MOS transistors. The LOCOS method, however, requires an extended heat cycle to grow the thick layer of thermal oxide. This is explicitly avoided in fabricating bipolar transistors in U.S. Pat. No. 4,381,953 (column 3, lines 5–6). Current bipolar technologies—exemplified by the Ho et al., Isaac et al. and Ko et al. patents and the Konaka et al. article—instead use various, planar etch-and-refill isolation techniques. A variation of such techniques that has been tried by Texas Instruments and Siemens (see Kranzer et al.) as a way to increase bipolar packing densities is trench isolation, reported in the "Electronics" article cited above.

Most of the efforts to solve alignment problems in both MOS and bipolar technologies have been directed to self-aligned processes. Various self-aligned processes are described in the patents cited above. State of the art in both MOS (see Ho et al.) and bipolar (see Oh et al.) technologies use a polysilicon layer patterned to form a gate or contact. This layer is covered by an insulative oxide box structure formed by silicon dioxide deposition or thermal growth followed by reactive ion etching. The box structure serves as a self-aligned mask in later ion-implantation steps.

In conventional bipolar processes, the active device features are generally formed as a square or nearly square emitter region concentrically positioned within a collector region of similar geometry The self-alignment techniques strive to form the horizontal features in both dimensions and for several process steps using a single photolithographic mask. Deposition of polysilicon on the substrate surface followed by out-diffusion of the dopant impurities into the substrate or epitaxial layer has also been used in these self-aligned techniques. The above-cited patent to Oh et al. uses this technique to form base regions self-aligned with base contacts provided by the polysilicon. Konaka et al., cited above, discloses use of a highly-doped polysilicon emitter contact to form a diffused emitter.

In epitaxial processes, such as Ko et al. and Kranzer et al., it is conventional to use an N-type buried layer under the epitaxial layer to reduce collector resistance $R_{cx}$ between the collector contact region and the active device region. The effectiveness of this approach decreases, however, as lateral device dimensions become smaller relative to vertical spacing between the active device and the buried layer. This approach also makes alignment of subsequent masking steps difficult, with attendant difficulties in obtaining economic yields, and increases collector-substrate capacitance $C_{cs}$, which tends to slow device operation. A triple diffused process, such as Miller et al., may increase yield but sacrifice speed, due to increased collector-base capacitance $C_{cb}$, and reduce saturation current, due to increased collector resistance $R_{cx}$. Conventional approaches to reducing collector-base capacitance by narrowing the emitter and base also tends to increase base resistance $R_{bx}$. Attempting to reduce collector resistance similarly tends to increase collector-substrate capacitance $C_{cs}$. Thus, significant tradeoffs are presented to the designer in selecting between conventional bipolar processes and, within a given process, between various performance parameters.

So far as known, no prior integrated circuit fabrication process has been devised that will enable operative very large scale integrated (VLSI) bipolar circuits to be made with both high density, speed and yield and low power. Accordingly, a need remains for a bipolar integrated circuit technology that will enable commercially-feasible, very large scale integration of bipolar circuitry.

SUMMARY OF THE INVENTION

One object of the invention is to build an integrated circuit fabrication process which produces high density, fast, low power, bipolar integrated circuits.

A second object of the invention is to bring to bipolar technology the MOS technology advantages of high yield, high density and low power while obtaining the speed advantages of bipolar devices.

A third object of the invention is to enable fabrication of VLSI bipolar circuits.

Another object is to increase the speed of VLSI circuits.

A further object of the invention is to reduce the power requirements of high-speed bipolar transistors.

Yet another object of the invention is to improve yield in the production of bipolar integrated circuits, particularly in LSI and VLSI levels of complexity.

An additional object is to reduce both collector resistance and collector-base capacitance without having to trade off increased base resistance and collector-substrate capacitance.

The invention attains the foregoing objects, and overcomes the difficulties and drawbacks of the prior art in a number of ways. Photolithographic resolution problems are solved by limiting the use of photolithography to the definition of features and feature sizes that are readily within the resolution capabilities of generally available photolithographic techniques. These techniques are supplemented, where necessary to define smaller horizontal feature sizes, by a combination of horizontally additive and subtractive masking techniques. These techniques are selected and controlled so as to define, with greater accuracy, feature sizes smaller than photolithographic techniques alone can readily produce. Alignment concerns are alleviated, with increased packing density, by adopting a masking strategy which renders most alignment steps noncritical within the tolerances that are readily provided by conventional alignment equipment. In general, this is done by separating the steps which define device features in each horizontal dimension.

Thus, in a preferred embodiment, a long, narrow collector region is formed in one collector masking step, the width of the collector region ultimately defining emitter length. Then, in a subsequent contact masking step, device features requiring a predetermined spacing and size are defined along the length of the collector region. The device features in this masking step are made long enough that they can readily transsect the collector region even if the mask is misaligned at the tolerance limits of the alignment equipment. The collector region itself is made long enough to permit a similar degree of misalignment of the mask along its length.

Self alignment of the collector region, the active transistor, and the collector, base and emitter contacts, is preferably used. The self-alignment scheme is designed to take advantage of the noncritical spacing of the preceding steps and uses steps which, themselves, are relatively simple and virtually fool-proof. Preferably, a first pattern-defining mask is used to define the collector region, with self-aligned surrounding channel stop and surface isolation, and forming the collector in the substrate, preferably by implantation and diffusion. A second pattern-defining mask is used to define two spaced-apart openings which transsect the collector region. Low resistivity regions are formed in the surface of the substrate within these openings, after which the openings are selectively closed, e.g., by thermal oxidation. Removal of the second mask exposes collector and base contact regions at opposite ends of the collector and a central active device or emitter region, in which a vertical bipolar transistor, preferably NPN, is formed. A single polysilicon layer can be used to form base, collector and emitter contacts, without building oxide box structures or using reactive ion etching. Preferably, the process is carried to using a triple diffusion, rather than epitaxial, technique. The low resistivity region between the collector contact and active device region makes a buried layer unnecessary.

These measures simplify the fabrication process, improve yield and packing density, and provide advantageous device characteristics. Despite a very high packing density, difficult isolation techniques such as trench isolation, as shown in various above-cited references, are not required. The problems of aligning a buried layer, surrounding isolation, and active device features in an epitaxial process are all avoided. Nor is intimate alignment of collector and base contacts with the emitter contact required.

VLSI bipolar integrated circuits having over 10,000 gates (25-50,000 transistors) per chip have been successfully fabricated in accordance with the preferred embodiment of the invention. These circuits exhibit performance comparable to conventional ECL devices but with a transistor area 1/20 as large and per gate power dissipation 1/10 as large as in conventional ECL bipolar devices. Moreover, these density and performance advantages have been obtained at production yields comparable to established MOS processes, two times conventional bipolar processes.

A further improvement of the preferred process and resultant transistor enables many of the tradeoffs that designers must ordinarily make in designing integrated bipolar devices to be decoupled. Instead of a linear sided or rectangular collector structure, this improvement uses what applicant refers to as a "keyhole" structure for the collector. Compared to the linear collector design, the keyhole collector is defined by the first pattern-defining mask, with a collector region that is wider in the collector contact region and adjoining low resistivity region extending to the emitter region, and is narrower in the base contact and emitter regions and intervening low resistivity region. This structure decouples the collector resistance Rcx and collector-base capacitance Ccb. As a result, these two parameters can be independently controlled; Rcx by increasing the width of the collector region and adjoining low resistivity region and Ccb by reducing the area of the base, base contact and intervening low resistivity region. This can be done without increasing collector-substrate capacitance Ccs. Additionally, it is preferred to reduce the dimensions of the low resistivity openings and their spacing (which defines the width of the emitter region) lengthwise of the collector region. This further reduces collector resistance Rcx and capacitance Ccb and offsets any increase in base resistance Rbx due to narrowing the base contact region and adjoining low resistivity region. These improvements substantially increase device performance.

The foregoing and other objects, features and advantages of the invention will become more readily apparent from the following detailed description which proceeds with reference to the drawings.

BRIEF DESCRIPTION OF THE DRAWINGS

FIG. 1 is a top plan view of a silicon substrate showing a collector region in which an NPN bipolar transistor is to be formed in accordance with the invention.

FIG. 2 is a cross-sectional view taken along lines 2—2 in FIG. 1 showing initial deposition, collector photolithography, etching and field implantation steps.

FIG. 3 is a view similar to FIG. 2, showing a nitride etch and undercut step.

FIG. 4 is a view similar to FIG. 3, showing the steps of stripping the low temperature oxide from the nitride layer and local oxidation of the field regions.

FIG. 5 is a view similar to FIG. 4, showing the steps of stripping the nitride layer and collector photolithography, ion implantation and drive-in.

FIG. 6 is a view similar to FIG. 5, showing the steps of low pressure vapor depositing successive layers of nitride and low temperature oxide, contact photolithography, and successive etching of the oxide and nitride layers.

FIG. 7 is a top plan view of the collector region as shown in FIG. 6.

FIG. 8 is a view similar to FIG. 6, showing P+photolithography and ion implantation steps to form a conductor in the substrate between the base contact and emitter regions.

FIG. 9 is a view similar to FIG. 8, showing N+photolithography and ion implantation steps to form a conductor in the substrate between the emitter and collector contact regions.

FIG. 10 is a view similar to FIG. 9, showing the step of undercutting the nitride layer.

FIG. 11 is a view similar to FIG. 10, showing the steps of stripping the low temperature oxide layer, base oxidation of the exposed silicon substrate, stripping of the nitride layer, and base photolithography and P implantation of the emitter and base contact regions of the substrate.

FIG. 12 is a view similar to FIG. 11, showing the steps of deposition of a polysilicon layer, photolithography and N+implantation of the polysilicon in the collector contact and emitter regions.

FIG. 13 is a view similar to FIG. 12, showing the steps of depositing of a third pair of successive layers of nitride and oxide, photolithography and etching of the oxide layer to selectively expose the nitride layer over the base oxide and field oxide regions.

FIG. 14 is a view similar to FIG. 13, showing the steps of etching the nitride layer, stripping the oxide layer and local oxidation of the exposed polysilicon.

FIG. 14a is a cross-sectional view of a resistor fabricated in accordance with the process of the invention, at the stage of fabrication of the transistor shown in FIG. 14, showing the photolithography, etching and local oxidation steps as used to define the width of the resistor.

FIG. 15 is a view similar to FIG. 14, showing the steps of stripping the nitride layer, photolithography and P implantation of the polysilicon in the base contact region.

FIG. 16 is a view similar to FIG. 15, showing the further steps of low pressure chemical vapor deposition of a fourth pair of layers of nitride and oxide and photolithography and etching to selectively expose the polysilicon contact layers in the collector and base contact regions and the emitter region.

FIG. 16a is a cross-sectional view of the resistor taken along lines 16a—16a in FIG. 13a, showing the photolithography and etching steps at a stage of fabrication corresponding to FIG. 16 as used to define the length and contact regions of the resistor.

FIG. 16b is a cross-sectional view taken along the same plane as FIG. 16, showing fabrication of a substrate contact in accordance with the process of the invention.

FIG. 17 is a view similar to FIG. 16, showing metallization of the contacts.

DETAILED DESCRIPTION OF PREFERRED EMBODIMENT

Figure 18:
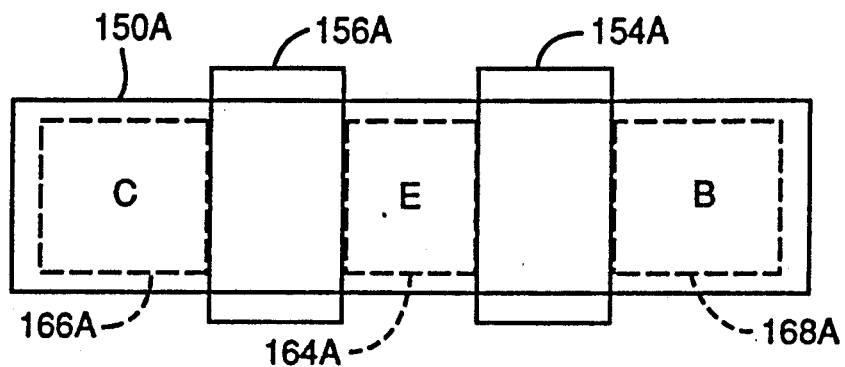
FIG. 18 is a top plan view to scale which is a composite of the views of FIGS. 1 and 7, the first (collector) and second (contact) pattern-defining masks shown in solid lines, and the polysilicon patterning mask (see FIG. 13), shown in dashed lines.

The below-described process is carried out on a substrate in the form of a <111> silicon wafer that has been lightly (P−) boron doped to provide a resistivity of greater than 30 ohm-cm. FIGS. 1–18 relate to the fabrication of a bipolar transistor, in accordance with the method of the present invention, on the silicon substrate in a predetermined, rectangular collector region 20. In laying out a VLSI-density circuit, a plurality of rectangular regions 20 of uniform length and width are positioned at a uniform spacing. In FIG. 1, for example, region 20 is shown as 3.4 um. wide and 12 um. long. A suitable spacing is provided by an 8 um. pitch in the widthwise direction and 16 um. in the lengthwise direction. These dimensions can be further reduced, e.g., by reducing pitch to a 1.2 um. spacing, or by scaling down device features within region 20, or both.

Prior to the steps shown in the figures, a thin (75 angstrom) pad oxide ($SiO_2$) layer is thermally grown on the surface of the substrate by dry oxidation, as known in the art. For purposes of the remaining description, the bulk of the substrate is identified by reference numeral 21, with a reference surface 22, upon which the process steps are carried out. The pad oxide layer is not shown, but is understood to form surface 22 of the substrate.

Referring to FIGS. 1 and 2, the process commences with low pressure chemical vapor deposition (LPCVD) of a layer 24 of nitride, followed by a layer 26 of low temperature oxide ($SiO_2$) Each of these layers is deposited to a thickness of approximately 1,000 angstroms. Next is a collector photolithography etching step. In this step, the region in which the bipolar transistor device is to be formed is covered with a layer of photoresist 30 which is rectangular in shape and has long, narrow dimensions, e.g., 12 um.×3.4 um. The oxide layer 26 is etched away around the photoresist to expose the surface of nitride layer 24. (HF-etch is used in all oxide etching steps.) This is followed by a field implantation step, in which the field regions surrounding the regions covered by photoresist layer 30 are ion implanted with boron to a depth of about 4,000 angstroms and a P+ concentration to form implanted channel stops 32.

Referring to FIG. 3, the next step is a first nitride etching step, to remove the nitride layer from the exposed field regions of the substrate. This etching step is carefully controlled to provide an undercut or recess 33, beneath the margins of oxide layer 26, for a distance 35 of about 5,000 angstroms. Then, the photoresist layer 30 is removed. This and subsequent nitride etching and stripping steps are carried out in a refluxer with a boiling (158° C.), concentrated phosphoric acid bath. The etch rate is about 40 angstroms per minute. The etch duration is controlled to determine the amount of undercut. The amount of undercut is preferably controlled to within plus or minus 20%. This undercutting spaces or insets the edge of the nitride layer relative to the inner boundary of implanted channel stops 32.

Referring to FIG. 4, the wafer is next subjected to an etching step to strip off the remainder of oxide layer 26, leaving the upper surface of nitride layer 24 exposed. Then, the wafer is subjected to an oxidation step at 950° C. for five hours locally to oxidize the exposed field regions, and thereby form field oxide layer 34. This step pushes a "bird's beak" oxide formation 36 beneath the margins of the nitride layer. The distance 37 of the protrusion of the bird's beak formation beneath the nitride is controlled, by controlling the thickness 38 to which the field oxide is grown, to precisely define the final dimensions of a narrow, reduced collector region. The oxide layer is preferably grown to a thickness 38 of about 8,000 angstroms, and the bird's beak correspondingly intrudes a distance of about 5,000 angstroms beneath nitride layer 24. The initial collector region width of 3.4 um. is reduced by an average of 1.0 um. by the nitride undercutting and then by an average 1.0 um., providing an average final width of 1.4 um. At the same time, the length of the collector region is reduced to about 10 um. This produces a reduced collector region 20a, as shown in FIG. 7.

Also, during the local oxidation step, the channel stop ions diffuse to form a broadened channel stop 40 of a P doping concentration. In a later step, shown in FIG. 5, a collector region implant 43 is diffused downward and laterally toward the channel stop. With the foregoing initial spacing, the resulting diffusion 44 forms a wide, shallow-gradient P-N junction with channel stop 40. This wide junction exhibits less capacitance than appears in epitaxial processes.

The foregoing steps employ a variation of the known LOCOS methods (see Philips Research Report 26, pages 162-63). The prior LOCOS methods were developed in MOS technologies to define the dimensions of MOS source and drain regions. They are not believed to have been used before in fabricating bipolar devices, particularly to critically define a small, nominally 1.4 um. emitter length and a spacing of the edges of the active device region from the junction between the diffused field channel stop 40 and collector region 44. The undercutting and local oxidation steps are statistically independent and variations are characterized by a Gaussian distribution. Controlling each to within, e.g., 20% tolerances (3 sigma), the combined precision of definition of the emitter length will be satisfactorily maintained at 1.4 um. +/−0.28 um., i.e., between about 1.1 um. and 1.7 um. Likewise, channel stop 40 remains spaced sufficiently from reduced collector region 20a over the foregoing range of variation.

Referring next to FIG. 5, a second nitride etch step is used to strip nitride layer 24, exposing substrate surface 22. This is followed by a second photolithography step, in which the field oxide layers are covered with a layer 42 of photoresist while leaving the silicon surface exposed in the reduced collector region. This step is followed by a collector region implant step, in which phosphorus ions are implanted to a depth of about 4,000 angstroms and an N+ concentration to form implanted collector region 43. Photoresist layer 42 is then stripped and the wafer is annealed at a temperature of 1100° C. for two hours, to diffuse or drive in the collector implant ions to a depth of about 1.4 um. This forms a much broader and deeper diffused collector region 44 with an N doping concentration.

Referring to FIG. 6, next a 1,500 angstrom layer 46 of nitride ($Si_3N_4$) followed by a 1,000 angstrom layer 48 of oxide ($SiO_2$) are low pressure chemical vapor deposited on the entire surface of the wafer, including over the field oxide and exposed substrate surfaces 22. This is followed by a third photolithography step which provides a layer of photoresist 50 having openings 54, 56 spaced apart a distance 58. The oxide layer 48 is etched within openings 54, 56, the resist is stripped, and nitride layer 46 is etched through these openings to selectively expose portions of substrate surface 22 within the openings.

Referring to FIG. 7, which shows the step of FIG. 6 in top plan view, openings 54, 56 are rectangular and parallel, with a spacing 58 and a width 60 of, e.g., 2 um. and a greater length 62, e.g., 4 um. The regions thus defined in this step are identified as the emitter region 64, the collector contact region 66, and the base contact region 68. Their longer dimension 62 is oriented approximately normal to the longer dimension of the collector region 20a. The spacing 58 between openings 54, 56 defines the emitter width which, for high density VLSI applications, is preferably 2 um. or less. The 2 um. width and spacing of the openings are selected to be easily within the resolution capabilities of conventional photolithographic techniques. As these techniques improve, these dimensions can be reduced to scale the present method to smaller device geometries.

The normal orientations of the long dimension of openings 54, 56 in relation to the length of collector region 20, and the fixed spacing 58 in a single mask of such openings makes alignment in this step substantially noncritical. Ideally, these openings are centered both widthwise and lengthwise on reduced collector region 20a, but need not be. The openings can be displaced from a centered position, either lengthwise along region 20a, or widthwise of the region. So long as openings 54, 56 transect region 20a with some minimal length, e.g., 1 um., of region 20a at each end to form collector and base contacts, an operative device can be fabricated. Thus, widthwise and lengthwise alignment tolerances of +/−1 um. are permitted while conventional alignment equipment can readily meet +/−0.5 um. tolerances. Also, angular alignment tolerances can be much looser than conventional techniques (e.g., 10:1 projection alignment and E-beam masking) are able to provide.

Referring to FIG. 8, a fourth photolithography step is performed to provide an implant mask, photoresist layer 70 defining an opening 72 which encompasses opening 54. Boron ions are implanted through opening 54 to form a P+low resistivity region or conductor 74 from an active transistor, to be formed in emitter region 64, to the base contact region 68. Implantation is conducted at relatively low energies so that conductor 74 is relatively shallow, e.g., 1,000 angstroms as implanted. At that energy level, the ions do not penetrate the nitride and oxide layers 46, 48. Consequently, the alignment of implant mask for this step is also substantially noncritical.

Referring to FIG. 9, photoresist layer 70 is removed. The mask and ion implant procedure illustrated and described in FIG. 8 is repeated to implant phosphorus ions through opening 56 to selectively implant within a larger opening 76 in photoresist 78 a shallow, e.g., 1,000 angstroms as implanted, N+low resistivity region or conductor 80 between the emitter region 64 and collector contact region 66.

Referring to FIG. 10, photoresist layer 78 is removed. The wafer is subjected to an etching step, like that described in connection with FIG. 3, to undercut nitride layer 46 to form recesses 82 under oxide layer 48. This step is controlled to space the edge of nitride layer 46 a predetermined distance 84 (e.g., 2,500 angstroms) from the implant boundaries of conductors 74, 80. This step reduces the as-masked dimension of emitter region 64 from 2 um. to about 1.5 um.

Referring next to FIG. 11, oxide layer 48 is stripped. The wafer is subjected to a thermal oxidation step (900° C., ¼ hour) to form thin (e.g., 1,000 angstrom) base oxide films 86, 88 on the exposed substrate surface in openings 54, 56, respectively. These films overlap implanted conductors 74, 80, respectively, by an amount determined by the distance 84 of undercut 82. This step produces some additional reduction in width of the emitter region, e.g., to about 1.0 um. The undercutting and oxidation steps thus provide the emitter region with a width that is defined by the spacing between the two openings 54, 56 less two times the sum of the first distance 84 and the distance of birdsbeak intrusion of oxide 86, 88 beneath the nitride layer 46. The implants forming conductors 74, 80 also slightly diffuse downward and laterally.

After the base oxide films are formed, the remainder of nitride layer 46 is stripped. Then, a fifth photolithography step is performed to provide a layer 90 of photoresist covering collector contact region 66 and extending over a portion of base oxide film 88, while leaving the emitter region 64 and base contact region 68 exposed. This is followed by a base implant step in which regions 64, 68 are implanted with boron ions to form a base implant 92 in emitter region 64 and a base conductor 93 in the base contact region 68. Implantation is conducted at energy levels comparable to those used in performing the P+ implant in FIG. 8. The doping concentrations, however, are somewhat lower, producing a P concentration. Some of the implanted ions penetrate the base oxide layers 86, 88. This somewhat increases the doping concentration in P+ region 74. It somewhat reduces the N-type doping concentration of region 80, although such region nevertheless remains N+ in net doping concentration. Also, as a result of ion penetration of the base oxide, implants 92 and 93 are connected beneath the margins of base oxide layers 86 to P+ region 74. The doping profile is further illustrated and discussed in connection with FIG. 16b.

Referring to FIG. 12, photoresist 90 is removed and the pad oxide (not shown) is stripped. A thin (e.g., 1,000 angstrom) layer 94 of LPCVD, undoped polysilicon is applied to the entire surface of the substrate, including over substrate surface 22 in regions 64, 66, 68. This layer also extends over the top surface of the field oxide 34 and base oxide layers 86, 88. After deposition of the polysilicon layer, a sixth photolithography step is performed to provide a photoresist layer 96 having an opening 98 over emitter region 64 and an opening 100 over collector contact region 66. These openings are sized, spaced, oriented and aligned in the same way as openings 54, 56 (FIGS. 6 and 7). Arsenic ions are implanted through these openings to implant the exposed portions of the polysilicon layer in the collector contact region 66 and in the emitter region 64. Subsequent diffusion of arsenic ions into the substrate silicon forms the emitter of an NPN transistor. This implantation step is performed by low-energy implantation to produce a shallow, although heavy (N+), doping concentration.

Referring to FIG. 13, resist layer 96 is stripped. A nitride layer 102 and an oxide layer 104 are deposited, by low pressure chemical vapor deposition, over the entire substrate. This is followed by a seventh photolithography step, to define a photoresist layer 106 selectively covering the emitter region 64 and the collector and base contact regions 66, 68, while leaving openings 108 over the field oxide and openings 110, 112. Like openings 54, 56 in FIG. 7, openings 110, 112 are non-critically aligned over the base oxide regions 86, 88, respectively. Oxide layer 104 is etched through these openings.

Next, referring to FIG. 14, resist layer 106 is stripped and nitride layer 102 is etched. Then, oxide layer 104 is stripped. This procedure leaves the upper surface of polysilicon layer 94 exposed atop the field oxide 34 and over base oxide regions 86, 88. The polysilicon layer 94 over the emitter region 64 and collector and base contact regions 66, 68 is shielded by the remaining portions of nitride layer 102. Finally, the wafer is subjected to an oxidation step at 950° C. for one hour to locally oxidize the exposed portions of polysilicon layer 94. In these areas, the polysilicon is converted to polyoxide 114, which insulates the remaining regions of polysilicon 94 over the emitter region 64 and collector and base contact regions 66, 68 from one another. The oxidation step also drives ions into the substrate from the doped regions of the polysilicon in collector contact regions 66 and emitter region 64. The out-diffusion of arsenic ions from the polysilicon in the emitter region forms the emitter 116 of the transistor. It also forms the collector contact conductor 118. This diffusion is launched only from the interface of the polysilicon layer with the reference surface. (This is so because diffusion proceeds very slowly through silicon dioxide.) Diffusion provides a concentration gradient that is greatest at the reference surface. Consequently, formation of a parasitic, off-vertical, edge transistor surrounding the vertical transistor is minimized. Therefore, the performance characteristics (i.e., breakdown voltage, speed) of the vertical transistor are not degraded by presence of a parasitic transistor.

Referring to FIG. 15, nitride layer 102 is stripped. This is followed by an eighth photolithography step to provide a layer of photoresist 120 having an opening 122 noncritically aligned over base contact region 68. The polysilicon layer 94, exposed in this opening is then shallowly implanted with boron ions to render the base contact conductive.

Referring to FIG. 16, photoresist layer 120 is stripped. A thin (250 angstrom) and nitride layer 124 and a 2,000 angstrom oxide layer 126 are deposited by low pressure chemical vapor deposition. This deposition step is followed by a ninth photolithography step, in which a layer of photoresist (not shown) is applied and patterned to form an opening 128 over the entire collector region. As further described below, this step serves to define other devices (see FIGS. 16a and 16b) formed on the substrate in preparation for metallization. The oxide layer 126 is etched through opening 128, the photoresist is removed, and the nitride layer 124 is etched to expose the upper surfaces of the polyoxide layer 114 and polysilicon layer 94 in the emitter region 64 and collector and base contact regions 66, 68.

Referring to FIG. 17, metallization is preferably accomplished by an additive process such as ion plating. As shown, the metallization lines are sized and spaced at a 4 um. pitch, but can be scaled along with preceding steps in the process as photolithographic techniques permit. The particular metallization process and structure form no part of the present invention and so are only briefly described. The preferred metallization method and structure is conventional (see, for example, Summers, D., "A Process for Two-Layer Gold IC Metallization," "Solid State Technology," December 1983, pages 137–141, and references cited therein). Briefly, this metallization process calls for depositing a thin film of palladium, reacting the palladium with the exposed surface of the polysilicon to form a silicide, and stripping the unreacted palladium. Next, a thin layer of a barrier metal such as titanium tungsten (TiW) is deposited, followed by deposition of a plating layer of palladium. This is followed by a metal photolithography step and ion plating a thick layer of gold onto the palladium to form emitter contact 130, collector contact 132 and the base contact 134. Additional insulative and conductive layers may be applied to form multilayer interconnects, as will be understood by those skilled in the art.

Referring next to FIGS. 14a and 16a, the foregoing method can be used easily to make resistors in a VLSI bipolar circuit. A resistor 140 is formed atop field oxide 34 at a location spaced conveniently (e.g., 4 um. pitch) from other structures. The polysilicon layer 94, deposited in the steps shown in FIG. 12, is patterned in the manner as shown in FIG. 13. Then, as shown in FIG. 14a, photoresist 106 and oxide layer 104 are removed, leaving an elongate strip of nitride layer 102 shielding a narrow portion of the polysilicon layer 94. The width of this strip is conveniently set at 2 um., and initially defines the width of resistor 140. Then, in the local oxidation step of FIG. 14, the exposed portions of the polysilicon are oxidized. This step isolates resistor 140 and defines a reduced, final width of the resistor, about 1.7 um.

Proceeding to the steps shown in FIG. 15, the nitride layer over the resistor is removed. The resistor polysilicon is then implanted with P-type boron ions simultaneously with implanting the base contact region 68.

Next, nitride and oxide layers 124, 126 are deposited and patterned as shown in FIG. 16a. This step defines the length 142 of the resistor, which can vary as required by the circuit design. A typical resistor length is 6.5 um. This step also provides contact openings at each end of resistor 140 for contact by metallization lines in the manner shown in FIG. 17. The contact openings are preferably sized and oriented in the manner shown in FIG. 7 so that alignment is noncritical.

FIG. 16b shows how a substrate contact 150 is formed in the disclosed method. In general, such a contact is formed in the same manner as a collector region, described above, with the differences next described. At the stage of fabrication shown in FIG. 5 the region where the substrate contact is to be formed is left covered by photoresist 40, so that it does not receive an N-type collector implant. It is covered by nitride and oxide layers 46, 48 and remains covered throughout the steps shown in FIGS. 6–10.

In the steps of FIG. 11, the region is opened for P-type implant 93a. The doping profile of implants 93, 92a has a peak, as-implanted concentration at a predetermined depth illustrated in FIG. 16b by dashed line 95. This depth is preferably about 1,000 angstroms and is determined by controlling implant energy. This depth is essentially constant in both silicon and silicon dioxide. Thus, the implant can extend beneath the bird's beak 36 but, because of the orientation of the surfaces of the bird's beak structure, the P-doped region terminates at the silicon-silicon dioxide interface as shown.

Then, in the steps shown in FIG. 12, it is covered by polysilicon layer 94 and by photoresist 96 to shield it from the N-type polysilicon implant. It is selectively covered during the steps of FIGS. 13 and 14, by nitride, oxide and photoresist layers 102, 104, 106 to pattern the polysilicon contact and to isolate it by local oxidation of the surrounding polysilicon. The substrate contact region is then opened in the steps of FIG. 15 for P-type implantation of the polysilicon layer. Referring to FIG. 16b, nitride and oxide layers 124, 126 are deposited, masked and patterned to selectively expose substrate contact 150. This step provides a contact opening for contact to the substrate by a metallization line in the manner shown in FIG. 17.

Several different types of LSI and VLSI bipolar circuits have been successfully manufactured in production quantities using the foregoing process. One such circuit is 16×16 bit fixed point multiplier, produced in both ECL and TTL versions. This circuit is fabricated on a 180 mil×180 mil die with an adder array totaling 11.6 K transistors in an area of 121 mils×135 mils. Control circuitry, on-chip latches and ECL 10 KH input-/output buffers bring the total transistor count to 13.8 K in a 166 mil×178 mil area. Typical power dissipation is 1.8 W in the adder array alone; input/output buffers, latches and control circuitry raise the total typical power to 2.9 W (2.2 W in TTL). The typical multiply propagation time for the worst-case path from input latch to output latch is 12 ns. Within the circuit, two-level series gating is used with a single −5.2 V supply. One subcircuit used in the multiplier is a 44-transistor, carry-save adder. The total gate size including fifteen polysilicon resistors is 9,200 um.$^2$. In terms of equivalent gates, this real subcircuit packs one gate per mil$^2$ at a power of 0.3 mW per equivalent gate. These are circuit densities equivalent to those produced by 1.5 um. CMOS technologies and power levels less than 1/10 of conventional bipolar integrated circuitry. Propagation delays are typically 300–600 ps per gate, depending on gate complexity and loading. At the transistor level, transistor size is 14 um.$^2$, cutoff frequency $f_t$ is greater than 5 GHz at 50 uA, and junction capacitances are on the order of 5–10 fF. In production of the multiplier circuits, the foregoing process exhibited very high yields, about 50% averaged over 10 production runs of 10 wafers each. Higher yields on some runs indicate that yields could increase to over 60% with experience.

Larger circuits have also been fabricated with corresponding success. One is 64×18-bit five-port register file. This circuit is fabricated on a 290 mil ×290 mil die and includes 45 K transistors. The ECL version of this circuit has a power dissipation of 3.9 W (3.0 W for TTL ), a typical read-write cycle time of 6 ns, a worst-case read-cycle time of 10 ns (15 ns for TTL), and throughput rates as high as 100 MHz. Average yield on a limited number of production runs (two runs of 20 wafers each) was 19%, but yields on individual wafers indicate potential for yields approaching 50%.

KEYHOLE TRANSISTOR EMBODIMENT

The processing flow for the keyhole transistor is identical to that of the rectangular transistor described above, with the exception that the shape of the collector mask and the size of certain mask features have been changed as is described in greater detail below.

For comparative purposes, FIG. 18 shows a composite top plan view, to scale, of the first and second pattern-defining masks (solid lines) used to pattern the photoresist layer 30 in FIGS. 1 and 2 and to pattern photoresist layer 50 in FIGS. 6 and 7, and the polysilicon patterning mask (dashed lines) for patterning photoresist layer 106 and underlying oxide layer 104 in FIG. 13. The patterned oxide layer is used to pattern the underlying nitride layer 102. Unetched portions of layer 102 protect the base and collector contact regions at opposite ends of the collector and the central emitter or active device region during local oxidation of the polysilicon layer. This step oxidizes the exposed areas of polysilicon surrounding the device and covering the low resistivity regions as shown in FIG. 14. The collector feature, identified by reference numeral 150A, is rectangular, with an initial length of 12 micrometers and width of 3.4 micrometers. The contact-defining features, identified by numerals 154A, 156A, are rectangular. The latter features are spaced, sized and ideally positioned so as to divide the length of the collector feature into contact regions 64, 66, 68 (see FIG. 7) of substantially equal length and width. The polysilicon patterning mask features, identified by numerals 164A, 166A, 168A to correspond to the contact regions, are rectangular. They are sized, spaced and ideally aligned edge-to-edge with the contact-defining features.

Figure 19:
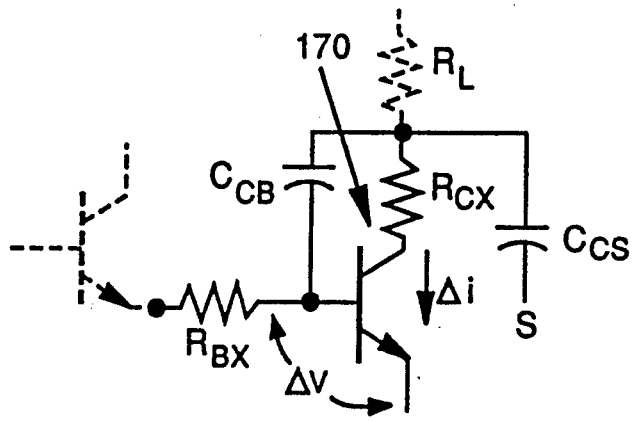
FIG. 19 is an electrical schematic model of a bipolar transistor, illustrating the parameters affected by the keyhole transistor structure.

FIG. 19 shows a general model of the bipolar transistor. The model shows an ideal bipolar transistor 170 having a parasitic series resistance Rbx in its base, a parasitic series resistance Rcx in its collector, a parasitic shunt capacitance Ccb between its collector and base, and a parasitic shunt capacitance Ccs between its collector and the substrate. Shown in dashed lines are another transistor having an emitter connected to the base of transistor 170 and a load resistance $R_L$ in series with the collector of transistor 170. Referring to FIG. 11, base resistance Rbx is essentially determined by the length, cross-sectional area and resistivity of the P-type low resistivity region 74. Collector resistance is similarly determined by the length, area and resistivity of region 80. Capacitance Ccb is determined by the area of interface of the N-type collector diffusion 44 with the P-type base 92, base contact diffusion 93 and low resistivity region 74, and the relative doping concentrations about this interface. Capacitance Ccs is similarly determined by the area of the interface between the collector diffusion 44 and the P-type substrate 21 and channel stops 40 and their relative dopings. As mentioned above, spacing the collector diffusion 44 apart from the channel stops 40 helps hold down this capacitance.

In transistor design, it is desirable to control base resistance as it, among other factors discussed below, limits device speed. It is also desirable to control collector resistance as it limits device saturation characteristics. In the rectangular collector design of FIG. 18, increasing collector width to decrease Rcx increases the entire width of the transistor, including the base and adjoining low resistivity region. This increases the area of interface between the P-type base and N-type collector diffusions and, in turn, increases base-collector capacitance Ccb.

Gate switching time is proportional to the time constant $$Ccb (Rbx+Rcx+RL)$$

The first factor indicates the dominant effect of base-collector capacitance Ccb. Control of load resistance $R_L$ is limited because it involves tradeoffs of power and noise margin as well as speed. Collector resistance Rcx should be reduced because of its effects on saturation. Base resistance $R_{bx}$ should also be reduced but will not have as much effect on speed as reducing base-collector capacitance Ccb.

Figure 20:
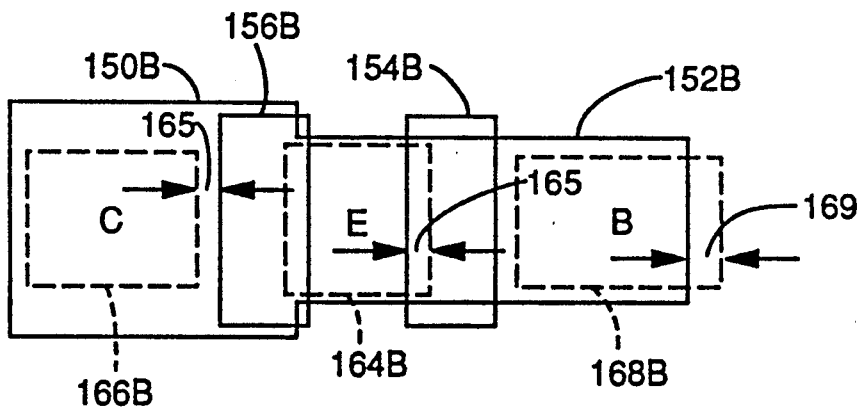
FIG. 20 is a view similar to FIG. 18, showing the a composite of the first and second pattern-defining masks and polysilicon patterning mask as used to form a keyhole transistor in accordance with the improved invention.

Turning to FIG. 20, the present improvement essentially decouples Rcx and Ccb by allowing the structural features that determine these two parameters to be defined independently. First, the collector feature is defined by a keyhole shape having a collector contact portion 150B that is enlarged widthwise and a base contact and emitter portion 152B that is narrowed relative to one another and to the rectangular embodiment described above. This arrangement allows a greater width between the collector contact and the emitter regions (e.g. 4.6 um.), thereby reducing collector resistance Rcx, without increasing the area of base-collector interface. Indeed, the base and emitter regions and interconnecting low-resistivity region can be narrowed (e.g., to 3.0 um.), thereby reducing base-collector interface area and the resultant base-collector capacitance Ccb.

The base contact and emitter portion 152B is preferably sized to an area not more than half the area of the collector contact portion 150B.

Second, the contact features, identified by numerals 154B, 156B, are spaced closer together (e.g., 1.8 um vs. 2.0 um.) and reduced in the dimension lengthwise of the collector feature (e.g., 1.4 um. for feature 156B and 1.2 um for feature 154B vs 2.0 um.). This reduces the length of the emitter region, enabling a smaller active device, and the length of the low resistivity regions, tending to reduce both Rcx and Rbx. The overall length of the collector feature can also be reduced, e.g. to 10 um.

Third, the polysilicon defining features, identified by reference numerals 164B, 166B, 168B, are enlarged to increase the tolerance for misalignment with prior features. In particular, the emitter feature 164B is not reduced with the spacing between the contact features but is preferably lengthened to overlap the contact features. This provides guardbands 165 over oxide layers 154B, 156B (e.g. total overlap of 0.5 um. divided about equally on each side of the emitter region) for protecting the area of polysilicon deposited on top of the surfaces of the silicon substrate 22 while leaving the polysilicon deposited on the field oxide 34, 36 and base oxide films 86, 88 exposed for later oxidation. This guardband is sized to approximate or exceed the typical range of variation in mask alignment, e.g. 0.3 micrometer. A similar guardband 169 is provided to overlap the end of the collector region adjoining the base contact region.

Figure 21:
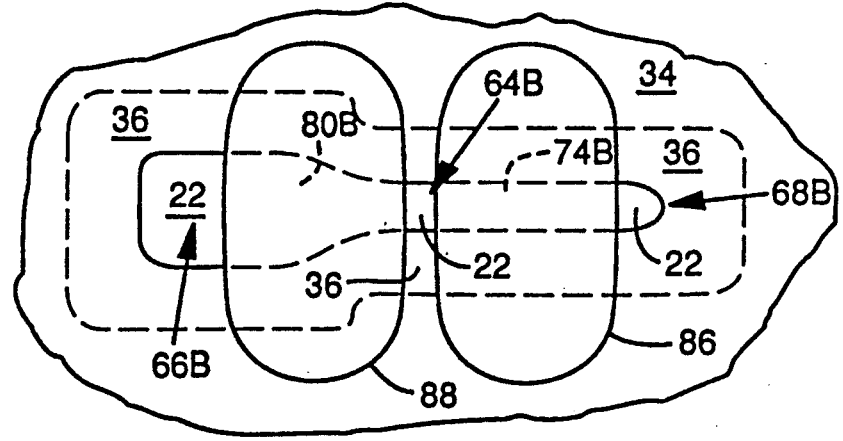
FIG. 21 is a top plan view of the keyhole transistor structure produced by the collector and contact feature masks of FIG. 20, shown at a stage corresponding to FIG. 11.

FIG. 21 shows the surface topography produced by the collector and contact feature masks of FIG. 20, at a stage corresponding to FIGS. 11 and 12, but without the implant masking. As discussed above in connection with the embodiment of FIGS. 1-18, the undercutting and local oxidation procedures reduce the initial dimensions of the collector feature by virtue of the field oxide 34 and bird's beak formation 36. In the illustrated example, the first nitride undercutting step reduces the width of the collector region about 1.2 um. The field oxide 34 is formed by oxidation at 1000° C. for five hours to produce a thickness of about 11,600 Angstroms and a bird's beak intrusion 36 of about 7000 Angstroms. These steps reduce physical collector length to about 8 um., reduce physical emitter length to about 0.8 um. (electrical length of 1.2 um due to emitter diffusion) and reduce the physical collector contact width to about 2.0 um. The closer spacing of the contact features 154B, 156B, followed by the second undercutting and oxidation steps of FIGS. 10 and 11, which produce the oxide ovals 86, 88 shown in FIG. 21, reduces the physical width of the emitter region 64B to about 0.8 um. Increasing the field oxide thickness also reduces capacitance between surface metallization and the substrate.

The resultant relative sizes of the exposed areas of silicon surface 22 in the collector contact region 66B, emitter region 64B and base contact region 68B are shown approximately to scale. The area of the collector contact region 66B is substantially greater than the area of the emitter region 64B by about an order of magnitude. Importantly, the electrical width of the N-type low resistivity region 80B near the collector contact region (about 2.6 um.) is greater than the electrical length of the emitter region by a factor of about two and then, approaching the emitter region, tapers down by nearly one-half to about the electrical width of the emitter region. This provides a conduction path from the collector contact region to the emitter region immediately beneath oxide layer 80B that is wider than the corresponding linear structure in the first embodiment. This reduces collector resistance Rcx.

At the same time, the emitter region 64B, base contact region 68B and P-type low resistivity region 74B are narrower, and thereby provide a lesser area of base-to-collector interface. The combined mask-defined area of the base contact, emitter and intervening portions of the initial collector region is about 60% of the overall area of the collector region in the first, linear embodiment. This combined area is reduced to just under 50% of the overall collector area in the keyhole design. These proportions are further reduced as the as-masked collector region is reduced by the undercutting and field oxidation steps prior to implanting the P-type low resistivity region, base contact and intrinsic base. This reduces collector-base capacitance Ccb.

Table 1 shows a comparison of performance characteristics of the keyhole transistor configuration with the linear configuration of the first embodiment.

TABLE 1

KEYHOLE vs. LINEAR TRANSISTOR COMPARISON

| PARAMETER (Units) | LINEAR | KEYHOLE | % IMPROVEMENT |
|---|---|---|---|
| 1. Cjc (fF/device) | 9.5 | 7.2 | 24% |
| 2. Rcx (ohms) | 1250 | 1060 | 18% |
| 3. Rbx (ohms) | 2150 | 2040 | 5% |
| 4. Metal 1 plate capacitance (fF/um$^2$) | .052 | .042 | 20% |

These parameters materially affect the performance of very large scale integrated circuits fabricated with the two configurations. Both configurations have been used to make essentially identical 32-bit (double precision-64 bit) floating point multiplier and arithmetic logic unit circuits, architecture of which is disclosed in commonly-assigned U.S. patent application Ser. No. 07/209,156, filed June 17, 1988. Table 2 compares performance of these circuits, as follows:

TABLE 2

LINEAR vs. KEYHOLE FMPY AND FALU COMPARISON

| DATA RATE PARAMETER | LINEAR | KEYHOLE |
|---|---|---|
| 1. Double precision multiply | 14 MFLOPS | 20 MFLOPS |
| 2. Double precision ALU | 33 MFLOPS | 40 MFLOPS |
| 3. Integer operations | 67 MIPS | 80 MIPS |

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

I claim:

1. A method of making a bipolar transistor in a very large scale integrated circuit, comprising:

providing a lightly doped P-type silicon substrate having an upper substrate surface for forming an integrated circuit;

forming a collector region having a length and a width bounded at the substrate surface by an insulative surface layer and within the substrate by a P-type channel stop beneath the insulative layer;

doping the substrate in the collector region to a first depth with N-type dopant;

masking and patterning an area encompassing the collector region so as to define a pair of spaced openings wherein portions of the substrate surface are exposed within the collector region;

sizing and arranging the openings to transsect the collector region and thereby divide the collector region lengthwise into three spaced-apart, covered regions including a collector contact region at one end of the collector region, a base contact region at the opposite end, and an emitter region spaced between the collector contact and base contact regions;

forming low resistivity regions in the portions of substrate exposed within said openings, including an N-type low resistivity region between the collector contact and emitter regions and a P-type low resistivity region between the base contact and emitter regions; and forming an NPN bipolar transistor by successive diffusion of a P-type base and N-type emitter in the emitter region and forming contacts in the collector and base contact and emitter regions;

the step of forming the collector region including sizing a first lengthwise end portion to a first width and a second, opposite end portion to a second width less than the first width and the masking and patterning step including positioning the collector contact region and adjoining opening over said first end portion so that the collector contact region and a portion of the N-type low resistivity region are formed with a width corresponding to the first width independently of the second width, whereby the width of the collector contact region is greater than the width of the emitter region.

2. A method according to claim 1 in which the second end portion is sized lengthwise of the collector region to include the base contact region, the emitter region and the P-type low resistivity region, so that the base and emitter of the transistor and the base contact region and P-type low resistivity region each have a dimension defined by the width of the second end portion of the collector region independently of the width of the collector contact region.

3. A method according to claim 1 in which a portion of the N-type low resistivity region adjoining the collector contact region is defined widthwise by said first width and the emitter length is defined by the second width.

4. A method according to claim 1 in which the second end portion includes the emitter region and is sized to an area not more than half the area of the first end portion.

5. A method according to claim 1 including:

selectively covering the substrate surface within the openings with an insulative layer and uncovering the collector and base contact and emitter regions to expose a portion of the substrate surface in each region;

depositing a layer of polysilicon over the insulative layer and substrate surface;

masking and patterning to protect the polysilicon layer selectively over the base and collector contact and emitter regions while exposing intervening and surrounding areas of the polysilicon layer; and oxidizing the exposed areas of the polysilicon layer to isolate the protected areas thereof;

the step of masking and patterning the polysilicon layer including defining a protected area overlapping the emitter contact region lengthwise of the collector by a predetermined margin extending over the low resistivity regions.

6. A method according to claim 5 in which the step of masking and patterning the polysilicon layer further includes defining a pair of protected areas over the base contact and collector contact regions spaced lengthwise from the protected area over the emitter region.

7. A method according to claim 1 in which the masking and patterning step includes:

depositing a layer of a first insulative material and a layer of a second insulative material, in turn, onto the substrate surface and insulative surface layer, the first and second materials being selectively susceptible to first and second etchants, respectively; and selectively removing the layers of first and second materials from the openings in the masked area to expose portions of the reference surface therein while leaving the collector contact, base contact and emitter regions covered.

8. A method according to claim 7 in which the first material is nitride and the second material is silicon dioxide.

9. A method according to claim 7 including:

undercutting the layer of first material a predetermined distance beneath the layer of second material around each of said exposed portions of substrate surface; and forming a silicon dioxide layer so as to cover the exposed portions of the substrate surface over said low resistivity regions, including a margin thereof defined by the distance of undercutting to produce a reduced emitter region having a width defined by the spacing between the two openings less two times the sum of the first and second distances.

10. A method according to claim 9 including ion-implanting dopant ions solely in the exposed portions of the substrate to form said low resistivity regions, spaced from the reduced emitter region by said margin.

11. A method according to claim 9 in which the silicon dioxide layer over the low resistivity regions is formed by local oxidation so that the layer intrudes a second distance beneath the layer of second material to define a further reduced emitter region.

12. A method according to claim 1 in which the steps of forming the contacts and bipolar transistor include forming an insulative layer on each of the exposed portions of the reference surface in said openings;

removing the layers of said first and second materials to expose the reference surface in the collector contact, base contact and emitter regions; and forming silicon layers over each of said collector and base contact and emitter regions;

selectively doping the silicon layer over the emitter and the collector contact regions with N-type ions; and selectively doping the silicon layer over the base contact region with P-type ions.

13. A method according to claim 1, in which forming the contacts and bipolar transistor includes:

forming an insulative layer selectively over the low resistivity regions;

forming a layer of silicon over each of said collector and base contact and emitter regions;

selectively doping the silicon layer over the emitter and the collector contact regions with N-type ions; and selectively doping the silicon layer over the base contact region with P-type ions.

14. A method according to claim 13 in which forming said low resistivity regions includes oppositely doping the exposed portions of the substrate.

15. A method according to claim 14 in which forming an insulative layer includes locally oxidizing a predetermined thickness of the substrate silicon within said openings so that the emitter region is reduced in width by an amount proportional to said thickness.

16. A method according to claim 13 in which the steps of forming and doping a silicon layer include:

depositing a layer of polysilicon over the substrate;

ion implanting the polysilicon layer in each region with ions of the dopant type therefor:

masking and patterning over the insulative layers to define openings selectively exposing the polysilicon over low resistivity regions; and thermally oxidizing the polysilicon exposed within said openings to electrically isolate the collector and base contact and emitter regions at the reference surface.

17. A method according to claim 1 in which forming said collector region includes:

masking, patterning and ion-implanting P-type ions selectively around the collector region to define said channel stop;

locally oxidizing a predetermined thickness of the substrate silicon selectively around the collector region so that the collector region is reduced in width by an amount proportional to said thickness; and ion implanting said N-type dopant selectively within the collector region.

18. A method according to claim 17 including:

spacing the P-type and N-type implantations a predetermined distance apart; and diffusing said implantations so as to form a shallow gradient P-N junction around the collector region.

19. A method according to claim 17 including locally oxidizing to form a field oxide having a thickness greater than 11,000 Angstroms.

20. A method according to claim 1 including;

scaling the collector region to an initial length of 10 um. and initial first width of 4.6 um. and initial second width of 3.4 um.;

reducing the initial width and length by about 2.6 um.;

sizing the spacing of the two openings to a scale of 1.8 um.; and reducing the maximum width defined by said spacing by about 1.0 um., thereby to produce an emitter region of an area of about 1.0 um.$^2$.

* * * * *